(12) United States Patent
Rateick, Jr.

(10) Patent No.: US 10,144,675 B2
(45) Date of Patent: Dec. 4, 2018

(54) SEGMENTED CARBON FIBER PREFORM (71) Applicant: Honeywell International Inc., Morris Plains, NJ (US)

(72) Inventor: Richard George Rateick, Jr., South Bend, IN (US)

(73) Assignee: Honeywell International Inc., Morris Plains, NJ (US)

(*) Notice: Subject to any disclaimer, the term of this patent is extended or adjusted under 35 U.S.C. 154(b) by 0 days.

(21) Appl. No.: 15/332,598

(22) Filed: Oct. 24, 2016

(65) Prior Publication Data
US 2018/0111882 A1 Apr. 26, 2018

(51) Int. Cl.
C04B 37/00 (2006.01)
B32B 3/14 (2006.01)
(Continued)

(52) U.S. Cl.
CPC .............. *C04B 37/001* (2013.01); *B32B 3/14* (2013.01); *B32B 3/18* (2013.01); *B32B 5/02* (2013.01); *B32B 5/18* (2013.01); *B32B 18/00* (2013.01); *B64C 25/42* (2013.01); *C04B 35/573* (2013.01); *C04B 35/806* (2013.01); *C04B 41/009* (2013.01); *C04B 41/91* (2013.01); *C23C 16/24* (2013.01); *F16D 65/125* (2013.01); *B32B 2255/20* (2013.01); *B32B 2262/106* (2013.01); *B32B 2266/04* (2013.01); *B32B 2307/306* (2013.01); *B32B 2605/18* (2013.01); *C04B 2235/428* (2013.01); *C04B 2235/616* (2013.01); *C04B 2237/083* (2013.01); *C04B 2237/36* (2013.01); *C04B 2237/385* (2013.01); *C04B 2237/60* (2013.01); *C04B 2237/82* (2013.01)

(58) Field of Classification Search
CPC .................................................... C04B 37/001
USPC ........................................................... 428/54
See application file for complete search history.

(56) References Cited

U.S. PATENT DOCUMENTS 5,895,716 A 4/1999 Fiala et al.
6,576,076 B1 6/2003 Tani
(Continued)

FOREIGN PATENT DOCUMENTS

EP 1359132 A1 5/2003
KR 20140015436 2/2014
WO 2005115945 A1 12/2005

OTHER PUBLICATIONS

Lin et al., "One-step synthesis of a multi-functional anti-oxidation protective layer on the surface of carbon/carbon composites," Carbon 50, El Sevier, received online Sep. 2011, 9 pp.
(Continued)

Primary Examiner — Brent T O'Hern
(74) Attorney, Agent, or Firm — Shumaker & Sieffert, P.A.

(57) ABSTRACT

The disclosure describes in some examples a technique that includes aligning a plurality of carbon preform segments in a staggered arrangement, where each carbon preform segment of the plurality carbon preform segment includes a carbon body including at least one of a plurality of carbon fibers or a carbon foam, and a silicon-based mixture including silicon particles. The techniques may include heating the staggered arrangement to react the silicon particles with the carbon body to bond the plurality of carbon preform segments together and form a ceramic matrix composite component.

20 Claims, 6 Drawing Sheets (51) Int. Cl.
    *B32B 3/18*     (2006.01)
    *B32B 5/02*     (2006.01)
    *B32B 5/18*     (2006.01)
    *B32B 18/00*     (2006.01)
    *B64C 25/42*     (2006.01)
    *C04B 41/00*     (2006.01)
    *C04B 41/91*     (2006.01)
    *C23C 16/24*     (2006.01)
    *F16D 65/12*     (2006.01)
    *C04B 35/573*     (2006.01)
    *C04B 35/80*     (2006.01)

(56) References Cited

U.S. PATENT DOCUMENTS

| | | |
|---|---|---|
| 7,588,179 B2 | 9/2009 | Simpson et al. |
| 2008/0242535 A1 | 10/2008 | Liu et al. |
| 2014/0084521 A1 | 3/2014 | Sauder et al. |
| 2016/0082695 A1 | 3/2016 | Swartz et al. |
| 2017/0362753 A1* | 12/2017 | Le Costaouec ........ D04H 1/413 |

OTHER PUBLICATIONS

Extended European Search Report from counterpart European Patent Application No. 17196954.6, dated Mar. 19, 2018, 6 pp.
Response to Communication pursuant to Rules 70(2) and 70a(2) dated May 2, 2018, from counterpart European Application No. 17196954.6, filed Jul. 24, 2018, 11 pp.

* cited by examiner

SEGMENTED CARBON FIBER PREFORM

TECHNICAL FIELD

The disclosure relates to the ceramic matrix composite materials, such as the manufacture of aircraft brake discs made of ceramic matrix composite materials.

BACKGROUND

Ceramic matrix composite materials are composite materials that include a matrix including carbon reinforced with carbon fibers. Ceramic matrix composite components can be used in many high temperature applications. For example, the aerospace industry employs ceramic matrix composite components as friction materials for commercial and military aircraft, such as brake friction materials.

Some composite composites, such as some ceramic matrix composite brake discs that are used in the aerospace industry, may be manufactured from carbon fiber preforms that include layers of carbon fibers, which may be densified using, for example, chemical vapor deposition/chemical vapor infiltration (CVD/CVI), vacuum/pressure infiltration (VPI), or resin transfer molding (RTM), to infiltrate the fiber preform with carbon or carbon precursor material.

SUMMARY

In some examples, the disclosure describes techniques for forming a ceramic matrix composite component that includes aligning a plurality of carbon preform segments in a staggered arrangement with each carbon preform segment of the plurality of carbon preform segments including a carbon body that includes at least one of a plurality of carbon fibers or a carbon foam, and a silicon-based mixture that includes silicon particles. The technique may include heating the staggered arrangement to react the silicon particles with the carbon body to bond the plurality of carbon preform segments together and form the ceramic matrix composite component.

In some examples, the disclosure describes an assembly that includes a plurality of carbon preform segments aligned in a staggered arrangement such that directly adjacent carbon preform segments are in direct contact with one another, where with each of the plurality of carbon preform segments includes a carbon body that includes a plurality of carbon fibers or a carbon foam and a silicon-based mixture that includes silicon particle deposited on the carbon body.

In some examples, the disclosure describes a ceramic matrix composite component that includes a composite body defining a plurality of regions of carbon material reactively bonded together by a silicon-carbide material, where the plurality of regions of carbon material include a plurality of carbon fibers or a carbon foam and where the plurality of regions of carbon material are aligned in a staggered arrangement.

The details of one or more examples of the disclosure are set forth in the accompanying drawings and the description below. Other features, objects, and advantages of the disclosure will be apparent from the description and drawings, and from the claims.

DETAILED DESCRIPTION

The present disclosure describes techniques for forming a carbon composite using a plurality of carbon preforms segments/discrete units that are collectively stacked and arranged into a desired shape and reactively bonded together to form the carbon composite. Each of the described carbon preform segments may include a carbon foam or a plurality of carbon fibers in combination with a silicon-based mixture. The discrete carbon preform segments may be uniform or differently sized to allow the segments to be aligned and stacked in a desired arrangement to produce a desired shape (e.g., disc brake). The stacked arrangement may then be heated under optional compression to induce reaction bonding between the silicon of the silicon-based mixture and the carbon of the carbon foam or fibers to form silicon carbide (SiC) and bond the individual carbon preform segments together producing the carbon composite. In some examples, the individual carbon preform segments can provide a greater degree of control and variability regarding the physical architecture in the resultant carbon composite including, for example, the regional density within the ceramic matrix composite component, the fiber architecture such as the orientation and population, or the like.

Figure 1:
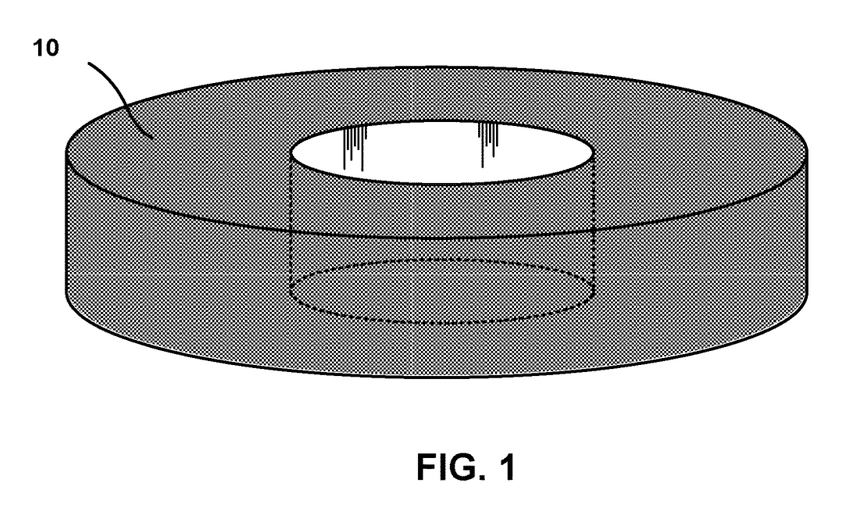
FIG. 1 is a perspective view of an example ceramic matrix composite component produced from a plurality of individual carbon preform segments.
Figure 2A:
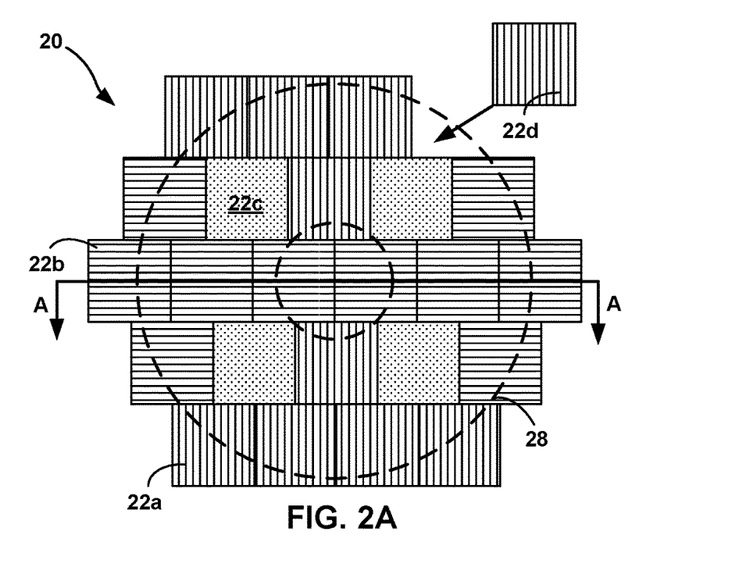
FIGS. 2A and 2B are schematic top (FIG. 2A) and cross-sectional (FIG. 2B) views of an example single-tiered arrangement of carbon preform segments that may be used to form the carbon composite of FIG. 1.
Figure 2B:
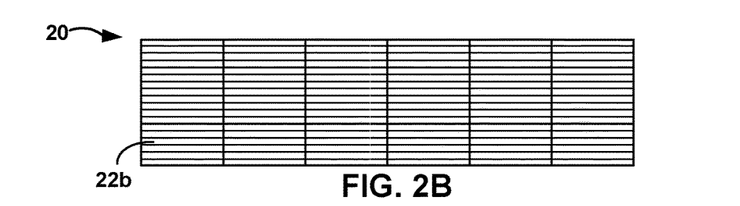

FIG. 1 is a perspective view of an example ceramic matrix composite component 10 produced from a plurality of individual carbon preform segments. FIGS. 2A and 2B are schematic top (FIG. 2A) and cross-sectional (FIG. 2B—cross-section taken along line A-A of FIG. 2A) views of an example single-tiered arrangement 20 of carbon preform segments 22a, 22b, 22c, 22d (collectively "carbon preform segments 22") that may be used to form the carbon composite of FIG. 1. As shown in FIG. 2A, carbon preform segments 22 may be aligned in a staggered arrangement (e.g., offset brick-and-mortar style pattern where the interfaces between carbon preform segments 22 do not form a grid pattern or continue linearly in both an x and y direction) to fulfil a desired template design such as disk brake template 28.

Figure 3A:
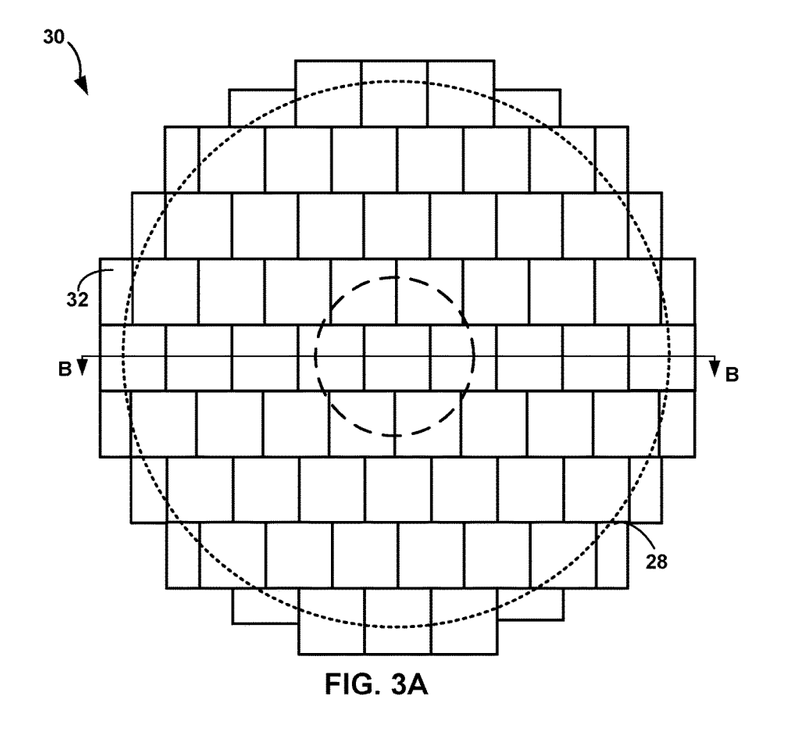
FIGS. 3A and 3B are schematic top (FIG. 3A) and cross-sectional (FIG. 3B) views of an example multi-tiered arrangement of carbon preform segments that may be used to form the carbon composite of FIG. 1.
Figure 3B:
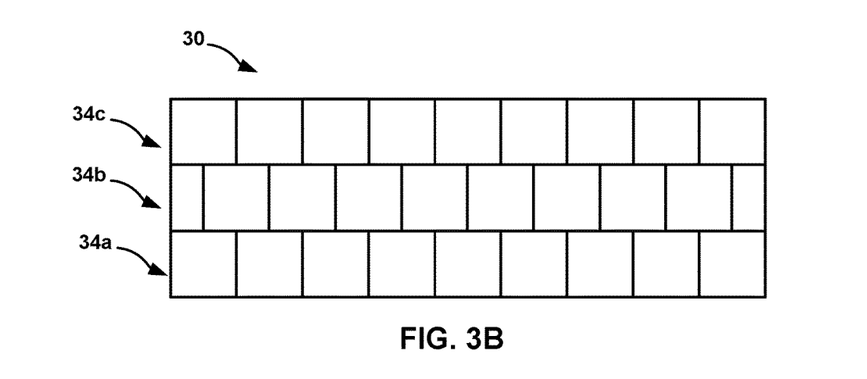
Figure 5:
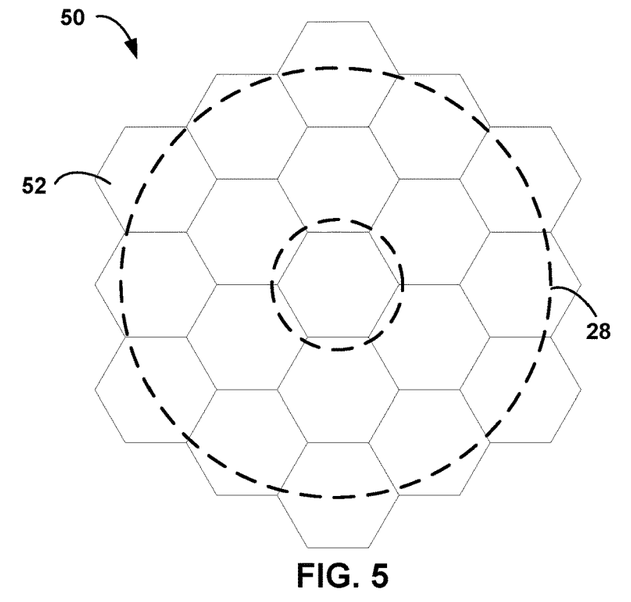
FIG. 5 is schematic top of another example staggered arrangement of carbon preform segments that may be used to form the carbon composite of FIG. 1.

Individual carbon preform segments 22 may be any suitable size and shape. For example, carbon preform segments 22 may be substantially square prism shaped (e.g., as shown in FIGS. 2A and 2B), box/cubical in shaped (e.g., as shown in FIGS. 3A and 3B), poly-prism shaped (e.g., triangular, rectangular, pentagon, hexagonal (e.g., as shown in FIG. 5), or the like), or combinations thereof. In some examples, the size and shape of the carbon preform segments 22 may be set so that adjacent faces between the carbon preform segments 22 intimately contact one another to eliminate gaps between the carbon preform segments 22 and ensure sufficient bonding between adjacent segments. In some examples, carbon preform segments 22 may each define a respective shape comprising a plurality of straight sides in which carbon preform segments 22 are aligned so that the respective straight sides of adjacent carbon preform segments 22 abut and form the staggered arrangement as shown by FIGS. 2A and 2B. In some examples, carbon preform segments 22 may be uniformly sized so as to proved efficient stacking arrangements and interchangeability between the segments. In some examples, a combination of carbon preform segment sizes and shapes may be used to help reduce waste of modify the seam architecture within resultant ceramic matrix composite component 10 as describe further below. In some examples the relative size of each carbon preform segment 22 may be about 5 millimeters (mm) to about the total thickness of the ceramic matrix composite component 10 (e.g., about 40 mm) depending on the desired shape, number of rows, number of layers, and the like. For example, carbon preform segment 22 may include at least one surface that defines a length of about 10 mm.

In some examples, the exterior surfaces of carbon preform segments 22 may include one or more geometric alignment features. For example, one or more of the surfaces of carbon preform segments 22 may include structural features such as, corrugated surfaces, protrusions and recesses, or the like that match and pair with corresponding structural features of an adjacent carbon preform segments 22. In some examples, the geometric alignment features may be interlocking or at least partially interlocking. The geometric alignment features may be used to provide a more robust stacking arrangement of carbon preform segments 22 to reduce the presence of gaps and ensure proper positioning of carbon preform segments 22 prior to bonding. Additionally or alternatively the geometric alignment features may provide greater structural integrity in resultant ceramic matrix composite component 10 by disrupting the continuity of bonding seam lines (i.e., a continuous line of two or more bond seams produced between the bonded carbon preform segments 22) so that the resultant bond seams are non-linear or at least partially non-linear.

Figure 2C:
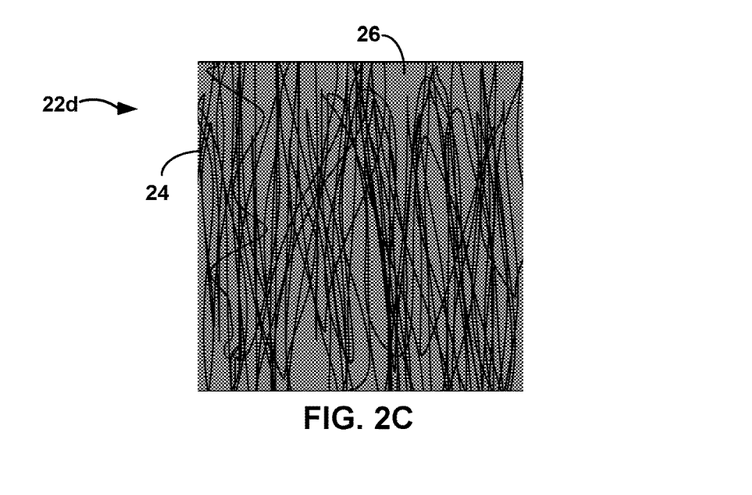
FIG. 2C is an enlargement of an example carbon preform segment illustrating a carbon body composed of a plurality of carbon fibers coated with a silicon-based mixture.

In some examples, carbon preform segments 22 may include carbon body formed 24 of a plurality of carbon fibers combined with a silicon-based mixture. For example, FIG. 2C is an enlargement of carbon preform segment 22d illustrating carbon body 24 composed of plurality of carbon fibers coated with a silicon-based mixture 26. In some examples, the plurality of carbon fibers forming carbon body 24 may provide form of a carbon fiber preform made of carbon fibers or carbon precursor fibers that have been pyrolyzed into carbon fibers. Examples of suitable carbon precursor fiber materials may include, for example, polyacrylonitrile (PAN), oxidized polyacrylonitrile (O-PAN), cellulose fibers (e.g., rayon or lignin), pitch fibers, or the like. Fiber preforms are constructed with carbon precursor fibers may be subjected to an initial carbonization cycle to convert the carbon precursor fibers to carbon fibers prior to the application of the silicon-based mixture 26.

In some examples, the carbon body 24 may include layers of carbon fibers bound together. For example, a plurality of carbon fibers may be combined into one or more layers of web fibers (e.g., randomly orient/entangled fibers), tow fibers, woven fibers, or combinations thereof that have been stacked and bound together. In some examples the fiber layers can be bound though via needling or punching some of the fibers across the different layers to mechanically bind the layers together thereby producing the fiber preforms used to form the individual carbon preform segments 22. In some examples the fiber layers may include precursor carbon fibers that are carbonized after the layers are bound together.

In some examples, the carbon fibers forming carbon body 24 may be selectively oriented such that the majority of the carbon fibers are oriented in a desired direction. For example, as shown in FIG. 2C, the fibers forming carbon body 24 are generally aligned vertically with the page. In some examples, the orientation of the carbon fibers within each carbon body 24 can be used to provide a greater degree of variability and control in constructing the fiber architecture of ceramic matrix composite component 10 that could not be obtained using traditional preform constructions. For example, during the assembly of single-tiered arrangement 20, majority of the carbon preform segments (e.g., carbon preform segments 22a, 22b, and 22d) may be arranged such that the plurality of carbon fibers forming the respective carbon bodies 24 generally align in the radial direction of brake disk template 28 while some of the segments (e.g., carbon preform segment 22c) may be arranged such that of the plurality of carbon fibers of the respective carbon body 24 generally align in the axial direction of brake disk template 28. In some examples, the orientations of the carbon fibers within each carbon preform segment 22 can be used to tailor the mechanical or thermal properties of the resultant ceramic matrix composite component 10. For example, the carbon fibers aligned in the radial direction of brake disk template 28 may impart greater breaking strength to the component while the carbon fibers aligned in the axial direction of brake disk template 28 may impart great shear strength. Additionally or alternatively, the orientation and length of the carbon fibers can behave as a thermal conduit transferring heat generated at the surface of the composite component 10 away from the surface to other desired locations.

Additionally, carbon The modular design of carbon preform segments 22 allows for a greater degree of control in tailoring the fiber architecture of ceramic matrix composite component 10 such that the composite component is be best suited for a particular application without requiring significant re-tooling expenses to modify and create a traditional carbon fiber preform.

In some examples, the respective fiber densities (e.g., number of fibers per unit volume) of carbon bodies 24 for carbon preform segments 22 may be substantially uniform to produce a ceramic matrix composite component 10 having a relatively uniform fiber density. In other examples, the fiber density of carbon preform segments 22 may be selectively varied to produce a ceramic matrix composite component 10 that includes a varied fiber density. Such a design flexibility may allow a designer to selectively increase the fiber density for specific regions of ceramic matrix composite component 10 to modify the strength characteristics of the selected regions.

In some examples, carbon body 24 may be composed of carbon foam coated with a silicon-based mixture 26. The carbon foam may include a three-dimensional, cross-linked network of carbon material establishing a porous, foam carbon body 24. The carbon foam may be produced using from pyrolysis of pitch in an inert environment. The extent of cross-linking of the pitch material prior to pyrolysis may be used to control the extent of foaming/porosity within carbon body 24. The more cross-linking within the pitch material prior to pyrolysis, the less porosity created. In contrast to a preform made of carbon fibers, a preform of carbon foam may be considered a substantially continuous, linked network of carbon material.

In some examples, the respective carbon bodies 24 (e.g., carbon fibers or carbon foam) of each carbon preform segment 22 may be at least partially densified prior to being coated with the silicon-based mixture 26. Any suitable densification technique may be used. For example, carbon body 24 can be initially densified using for example resin infiltration carbonization. Examples of suitable resin materials may include, for example, thermoset resins including, for example, furan, phenolic (e.g., diphenyletherformaldehyde), polyimide, or the like; thermoplastic resins including, for example, coal tar, petroleum, or synthetic pitch, polyetheretherketone (PEEK), polyethylenimine (PEI), polybenzimidazole (PBI), polyarylacetylene, or the like. In other examples, the carbon fiber preform can be initially densified using chemical vapor infiltration (CVI) or chemical vapor deposition (CVD) to achieve a carbon preform exhibiting a desired initial density. Suitable CVI/CVD materials may include methane mixed with other light alkanes or alkenes.

In some examples, the relative size of each carbon preform segment 22 may significantly reduce the time and expense needed to collectively densify the respective carbon bodies 24 within all carbon preform segments 22 compared to the time and expense needed to densify a singular carbon preform structure of comparable target size and shape (e.g., the size and shape of carbon preform segments 22 when stacked and arranged in the shape of ceramic matrix composite component 10). For example, one particular challenge associated with densifying carbon preforms is delivering/forming a sufficient amount of carbon material into the center of a preform body. When using, for example, a CVI/CVD densification process the delivery parameters of the carbon material are usually depended on the surface area of the preform body (e.g., points on influx), sized of openings within the preform, and the distance the carbon material must travel to reach the center of the preform body. In some examples, the deposition/formation of carbon material within the surface regions of the preform body can inhibit the ability of additional carbon material to reach the center of the preform body resulting in a density gradient within perform body and limiting the amount by with the preform can be densified. Additionally or alternatively, the relatively lager distance that the carbon material must travel often correlates to larger processing times. Due to the relatively small size and shape of each carbon preform segment 22, the distance that the carbon material must travel to reach the center of the preform segment 22 remains relatively small thereby reducing or avoiding several of the complications associated with densifying larger preform bodies. In some examples, the processing times to collectively densify carbon preform segments 22 may be reduced by as much as $\frac{1}{6}$ of the normal processing time for a similarly sized carbon fiber preform.

The initial density of carbon preform segments 22 prior to being coated with the silicon-based mixture 26 may be any suitable amount and may depend in part on the desired application for ceramic matrix composite component 10. In some examples, each carbon preform segment 22 may be initially densified to substantially the same extent to form a ceramic matrix composite component 10 having a substantially uniform density (e.g., uniform or nearly uniform density thought the body of ceramic matrix composite component 10). In other examples, the individual carbon preform segments 22 may be densified to different extents. For example, carbon preform segments 22 towards interior regions of single-tiered arrangement 20 such as segment 22c or those segments closer to the inner diameter of brake disk template 28, may be densified to a greater extent to provide greater strength to specific regions within the resultant body of ceramic matrix composite component 10. In some examples involving multi-tiered arrangements (e.g., multi-tiered arrangement 30 of FIG. 3B), interior layers or tiers (e.g., layer 34b) of the arrangement may be densified to a greater extent than exterior layers or tiers (e.g., layers 34a and 34c) to help reduce the amount and duration of any post bonding densification cycles that are applied. In some examples, the density of carbon preform segments 22 prior to being coated with the silicon-based mixture 26 may be about 1.75 grams per cubic centimeter (g/cc) to about 1.89 g/cc. In some examples, the density of carbon preform segments 22 prior to being coated with the silicon-based mixture 26 may be at least 1.8 g/cc.

Carbon preform segments 22 include silicon-based mixture 26 applied to the underlying carbon body 24. Silicon-based mixture 26 may include silicon particles in a carrier fluid. The silicon particles may be any suitable size to allow sufficient infiltration into at least the exterior surface regions of carbon preform segments 22. In some examples, the silicon particles may be less than about 30 μm. For example, the silicon particles may have an average size of about 20 μm.

Silicon-based mixture 26 may include any suitable carrier fluid, including for example, distilled water, ethanol, hydrocarbons, and the like. In some examples, silicon-based mixture 26 may be initially prepared to include greater than about 50 percent weight by volume (% w/v), e.g., about 58% w/v, of the silicon particles to volume of carrier fluid.

In some examples, silicon-based mixture 26 may include one or more additives. For example, silicon-based mixture 26 may include an adhesion promoter to assist with securing the silicon particles to the underlying carbon body 24 prior to undergoing reactive bonding and is substantially removed (e.g., burned) from carbon preform segments 22 during the reactive bonding process. Any suitable adhesion promoter may be used including, for example, ammonium alginate, agar, agarose, or the like. Additionally or alternatively, silicon-based mixture 26 may include one or more surfactants to aid in the transport of the silicon particles during the coating process. In some examples, the one or more additives may be present in an amount of about 2% w/v, e.g. 2.15% w/v, based on the volume of carrier fluid.

Silicon-based mixture 26 may be applied to the underlying carbon body 24 of carbon preform segments 22 using any suitable technique including for example, dip coating, slurry spraying, slip application, or the like. Once coated into the carbon body 24, the carrier fluid of silicon-based mixture 26 may be substantially removed (e.g., removed or nearly removed) from carbon preform segments 22 prior to bonding the segments together. In some examples, the carrier fluid may be removed by drying carbon preform segments 22 using a heated gas. In other examples, the carrier fluid may be removed as part of reaction bonding process during the heating phase prior to the point of reacting the silicon and carbon.

Any suitable amount of silicon material may be added to carbon body 24. In some examples, the silicon material may be added to achieve a coverage of about 0.15 g/cm$^2$ of silicon particles on the respective bond surfaces of carbon preform segments 22 with a tolerance of about +35% to −10%. The total amount of silicon coverage will ultimately be based on the density and or porosity of carbon body 24 at the time of joining.

While FIGS. 2A and 2B illustrate carbon preform segments 22 aligned as single-tiered arrangement 20, in other examples, carbon preform segments 22 may be stacked and aligned to produce a multi-layer arrangement that includes at least two tiers (e.g., layers) of stacked carbon preform segments 22. For example, FIGS. 3A and 3B are schematic top (FIG. 3A) and cross-sectional (FIG. 3B taken along line B-B of FIG. 3A) views of an example multi-tiered arrangement 30 of carbon preform segments 32 that may be used to form carbon composite 10 of FIG. As illustrated in FIG. 3B, in some examples, the staggered arrangement of carbon preform segments 32 may be continue throughout multi-tiered stack 30 such that carbon preform segments 32 within the respective layers 34a, 34b, 34c are offset from carbon preform segments 32 of an adjacent layer. The staggered arrangement may be used to help disperse the location of the seams between the carbon preform segments 32 throughout multi-tiered stack 30 so as to reduce the total number of continuous seam lines (i.e., a continuous line of two or more bond seams produced between the bonded carbon preform segments 32) present within the stack that would otherwise occur in, for example, a standard grid arrangement. In some examples, dispersing the seams throughout multi-tiered stack 30 may increase the strength of the resultant component (e.g., ceramic matrix composite component 10) by dispersing any mechanical stress exerted on the component through the body of the component rather than along a particular continuous seam line. In some examples, carbon preform segments 32 may each define a respective shape comprising a plurality of straight sides in which carbon preform segments 32 are aligned so that the respective straight sides of adjacent carbon preform segments 32 abut and form the staggered arrangement as shown by FIGS. 3A and 3B.

While FIG. 3B illustrates multi-tiered stack 30 including discrete layers 34a, 34b, 34b of carbon preform segments 32, in some examples the carbon preform segments 32 may be sized and shaped such that the carbon preform segments 32 are staggered stacked in a vertical direction (e.g., up and down with the page). In such examples, multi-tiered stack 30 may lack the presence of discrete layers yet still contain multiple tiers of carbon preform segments 32 such that the height of multi-tiered stack 30 is greater than the height of an individual carbon preform segment 32.

Figure 4:
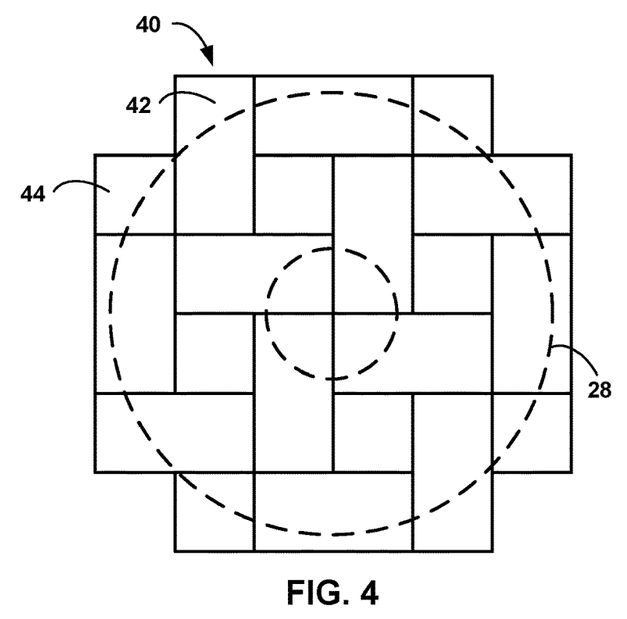
FIG. 4 is schematic top of another example staggered arrangement of carbon preform segments that may be used to form the carbon composite of FIG. 1.

FIG. 4 provides another schematic top view of an example staggered arrangement 40 of carbon preform segments 42, 44 that can be used to form ceramic matrix composite component 10. Staggered arrangement 40 may be single-tiered or a multi-tiered arrangement. In some examples, staggered arrangement 40 may include a combination of both rectangular carbon preform segments 42 and square carbon preform segments 44. In some examples, the combination of carbon preform segments 42, 44 of different shapes and sizes can be interposed throughout staggered arrangement 40 to reduce the presence of continuous seam lines, disrupt or otherwise break up the continuity of such seam lines, or a combination thereof. In some examples, carbon preform segments 42, 44 may each define a respective shape comprising a plurality of straight sides in which carbon preform segments 42, 44 are aligned so that the respective straight sides of adjacent carbon preform segments 42, 44 abut and form the staggered arrangement as shown by FIG. 4. Additionally or alternatively, the combination of carbon preform segments 42, 44 of different shapes and sizes can be used so as to reduce the amount of waste (e.g., the body of carbon preform segments needing to be removed after bonding to shape ceramic matrix composite component 10 into a desired configuration.

FIG. 5 provides another schematic top view of an example staggered arrangement 50 of carbon preform segments 52 that can be used to form ceramic matrix composite component 10. Staggered arrangement 50 may be single-tiered or a multi-tiered arrangement. In some examples, staggered arrangement 50 may include a plurality of carbon preform segments 52 in the shape of a multi-faceted prisms, such as pentagonal prisms, hexagonal prisms as shown in FIG. 5, or the like. In some examples, the multi-faceted shape of carbon preform segments 52 may help reduce the amount of waste material generated after staggered arrangement 50 is bonded and shaped to disk brake template 28. Additionally or alternatively, the multi-faceted shape of carbon preform segments 52 can help reduce, disrupt, and/or eliminate the presence of continuous seam lines in the resultant ceramic matrix composite component 10. In some examples, carbon preform segments 52 may each define a respective shape comprising a plurality of straight sides in which carbon preform segments 52 are aligned so that the respective straight sides of adjacent carbon preform segments 52 abut and form the staggered arrangement as shown by FIG. 5.

Once the carbon preform segments have been stacked and arranged in any desired shape and pattern, the carbon preform segments may be heated to melt the silicon of silicon-based mixture 26 (e.g., heat to greater than about 1414° C.) and induce reactive bonding between the silicon and the carbon within the carbon preform segments (e.g., carbon body 24).

Figure 6:
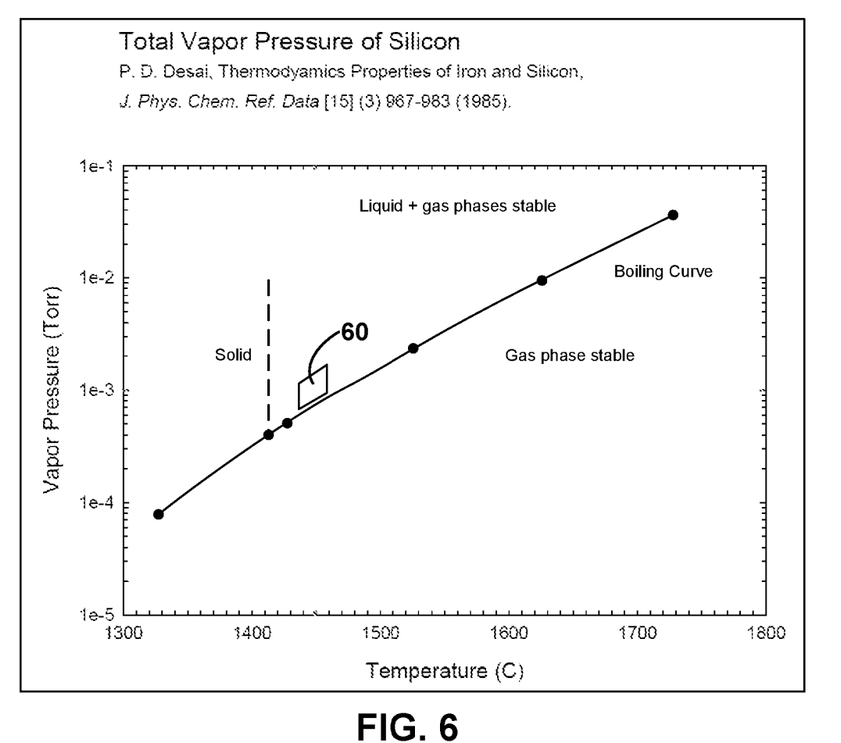
FIG. 6 is a phase transition plot that illustrates an example boiling point curve for silicon as a function of vapor pressure and temperature.

In some examples, the heating and reaction bonding may occur in a substantially oxygen-free environment (e.g., free of oxygen or containing trace amounts of oxygen) so as minimize the amount silicon material that undergoes oxidation during the reaction bonding or the presence of oxygen induced side reactions. In some examples, the substantially oxygen-free environment may be established by heating carbon preform segments under a partial vacuum. A partial vacuum may be preferable to a full vacuum so as to prevent the silicon from vaporizing upon melting. FIG. 6 shows a phase transition plot that illustrates an example boiling curve for silicon as a function of vapor pressure and temperature. Area 60 represents a pressure and temperature ranges, which may be suitable for inducing reactive bonding between the silicon and carbon materials. In some examples, the reaction may occur under a partial vacuum of about $1 e^{-3}$ Torr and a temperature of about 1450° C. In some examples, the substantially oxygen-free environment may also include one or more oxygen getters to further reduce the amount of oxygen present in the environment. In other examples, the substantially oxygen-free environment may be established using an inert gas including for example, nitrogen, argon, or the like.

The resultant ceramic matrix composite component 10 formed via reactively bonding the carbon preform segments together may include a carbon-carbon-silicon carbide composite structure having the presence of silicon carbide. For example, the reactively bonding the carbon preform segments may result in a ceramic matrix composite component that exhibits of brick-and-mortar composite body with defined regions of carbon material (e.g., the brick regions) and defined regions of silicon-carbide material (e.g., the mortar regions) corresponding to the reacted seams created by the silicon material reacting with carbon. In some examples, the presence of silicon carbide throughout the structure may modify one or more of the mechanical strength properties, tribological properties, or thermal properties of the resultant ceramic matrix composite component 10 compared to a comparable single-body preform that is infiltrated with molten silicon.

Any suitable number of layers and quantity of carbon preform segments 22, 32, 42, 44, 52 may be used to form ceramic matrix composite component 10. In some examples, ceramic matrix composite component 10 may be formed from at least two tiers (e.g., layers) of carbon preform segments 22, 32, 42, 44, 52 and include on the order of about 1000 individual carbon preform segments 22, 32, 42, 44, 52 per layer (e.g., a two layer stack may include about 2000 individual carbon preform segments).

Figure 7:
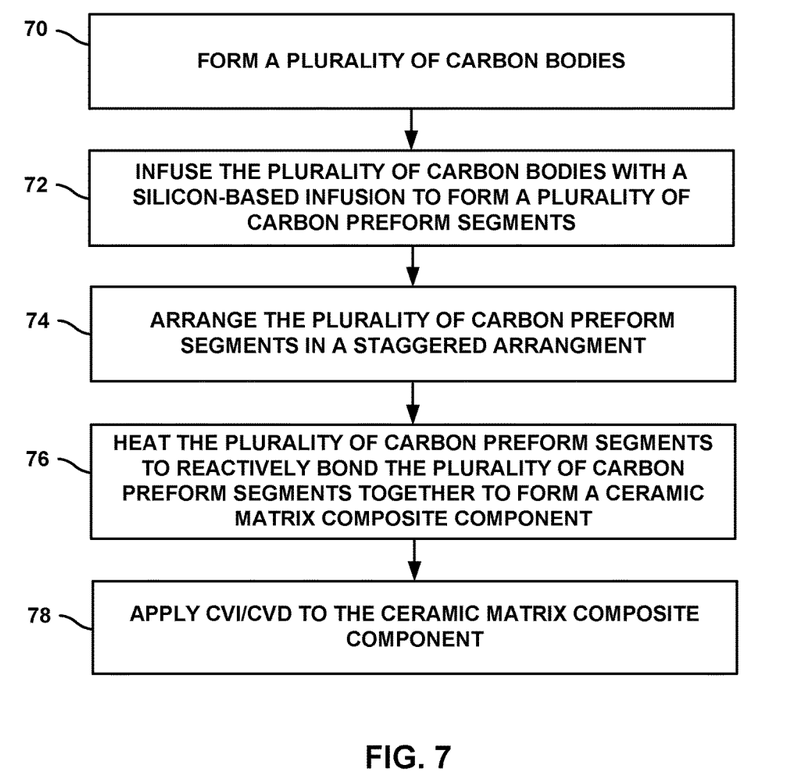
FIG. 7 is a flow diagram illustrating an example technique of manufacturing a ceramic matrix composite component such as the ceramic matrix composite component of FIG. 1.

The carbon preform segments and the resultant ceramic matrix composite component described herein can be formed using any suitable technique. FIG. 7 is a flow diagram of an example method of forming the carbon preform segments and ceramic matrix composite components described herein. While the techniques of FIG. 7 are described with concurrent reference to the conceptual diagram of FIGS. 1-3, in other examples, the techniques of FIG. 7 may be used to form other carbon preform segments and composite components, or the articles of FIGS. 1-3 may be formed using a technique different than that described in FIG. 7.

The technique of FIG. 7 includes forming a plurality of carbon bodies 24 (70), coating the plurality of carbon bodies 24 with a silicon-based mixture 26 to form a plurality of carbon preform segments (72), arranging the plurality of carbon preform segments 22 in a staggered arrangement (74), heating the plurality of carbon preform segments 22 to reactively bond the plurality of carbon preform segments 22 together to form a ceramic matrix composite component 10 (76), and applying CVI/CVD to the ceramic matrix composite component (78).

Carbon bodies 24 can be formed (70) using any suitable technique. As described above, the respective carbon bodies 24 of plurality of carbon preform segments 22, may be formed from a plurality of carbon fibers, carbon precursor fibers that have undergone carbonization to form carbon fibers, or carbon foam that have been sized and shaped to form carbon body 24 of a respective carbon preform segment 22. In some examples in which the carbon body 24 includes carbon fibers, the carbon fibers may be provided in any suitable arrangement. For examples, plurality of carbon fibers may be combined into one or more layers of web fibers (e.g., randomly orient/entangled fibers), tow fibers, woven fibers, or combinations thereof that have been stacked and bound (e.g., needled) together. In some examples, the carbon fibers may be selectively oriented such that the majority of carbon fibers within an individual carbon preform segment 22 are aligned in a desired direction.

In some examples, carbon bodies 24 may be at least partially densified prior to being coated with the silicon-based mixture 26. As described above, any suitable densification technique may be used including, for example, resin infiltration carbonization, CVI, CVD, or similar densification process.

The technique of FIG. 7 includes coating carbon bodies 24 with a silicon-based mixture 26 (72). As described above, the silicon-based mixture may include silicon particles mixed in a carrier fluid such as distilled water, ethanol, hydrocarbons, or the like. In some examples, the silicon-based mixture may include one or more optional additives including, for example, adhesion promoters such as ammonium alginate, agar, agarose, or the like; surfactants; antioxidants; carbon source material; or the like.

In some examples, carbon preform segments 22 may be machined to a desired size and shape so as to provide sufficient alignment and stackability between the segments. In some examples, carbon preform segments 22 maybe have as relative size of about 5 mm to about 40 mm. In some examples, the carbon preform segments 22 maybe have as relative size of about 5 mm to about half the thickness of ceramic matrix composite component 10 (e.g., about 20 mm).

Once carbon bodies 24 are coated with silicon-based mixture 26 (72), carbon preform segments 22 may be arranged in a staggered arrangement (74) (e.g., single-tiered arrangement 20, multi-tiered arrangement 30, staggered arrangement 40, 50, or the like). In some examples, the staggered arrangement as opposed to a grid-arrangement may reduce or disperse the presence of bonding seam lines within resultant ceramic matrix composite component 10, which may help to more evenly distribute mechanical forces across the seams throughout ceramic matrix composite component 10. In some examples, the staggered arrangement may include a single-tiered arrangement 20 or a multi-tiered arrangement 30.

After alignment, carbon preform segments 22 may be heated to reactively bond the plurality of carbon preform segments 22 together to form a ceramic matrix composite component 10 (76). In some examples, carbon preform segments 22 may be uniformly heated to melt the silicon (e.g., greater than about 1414° C.) and induce reaction between the silicon and carbon of carbon body 24 to produce silicon carbide (SiC). In some examples, the heating process may take place in a substantially oxygen-free environment including, for example, an inert gas environment (e.g., argon or nitrogen) or under partial vacuum (e.g., about 1 e$^{-3}$ Torr). Optionally, one or more oxygen getters may be used to capture trace amounts of oxygen.

In some examples, carbon preform segments 22 may be mechanically compressed during the heating process to substantially eliminate (e.g., eliminate or nearly eliminate) the presence of any gaps along the bond seams within the staggered arrangement 20, 30, 40, 50. For example, carbon preform segments 22 may be placed in a circular clamp or springform that surround staggered arrangement 20 and applies radial pressure to carbon preform segments 22. In some examples involving a multi-tiered arrangement 30, an additional compressive force may be applied to the two major surfaces of the multi-tiered arrangement 30 to compress the layers (e.g., layers 34a, 34b, 34c) or tiers together.

Once bonded, the resultant ceramic matrix composite component 10 may be subsequently processed including, for example, machined in to a desired shape (e.g., brake disk), further densified by applying CVI/CVD to the ceramic matrix composite component (78), heat treated (e.g., graphitized at a temperature greater than about 1600° C.), topically treated (e.g., antioxidant coatings or sealants applied topically), or the like.

Various examples have been described. These and other examples are within the scope of the following claims.

What is claimed is:

1. A method for forming a ceramic matrix composite component, the method comprising:
aligning a plurality of carbon preform segments in a staggered arrangement to form at least one layer of the plurality of carbon preform segments, wherein each carbon preform segment defines a respective shape comprising a plurality of straight sides, wherein the plurality of carbon preform segments are aligned so that respective straight sides of adjacent carbon preform segments abut and form the staggered arrangement, and wherein each carbon preform segment of the plurality of carbon preform segments comprises:
a carbon body comprising at least one of a plurality of carbon fibers or a carbon foam, and
a silicon-based mixture comprising silicon particles; and
heating the staggered arrangement to react the silicon particles with the carbon body to bond the plurality of carbon preform segments together and form the ceramic matrix composite component.

2. The method of claim 1, further comprising for each carbon preform segment of the plurality of carbon preform segments:
forming the carbon body; and
coating the carbon body with the silicon-based mixture.

3. The method of claim 2, wherein forming the carbon body comprises:
needling a plurality of fiber layers comprising carbon precursor fibers;
carbonizing the carbon precursor fibers to form the plurality of carbon fibers; and
densifying the carbon body.

4. The method of claim 2, wherein coating the carbon body with the silicon-based mixture comprises at least one of submersing the carbon body in the silicon-based mixture, spray coating the silicon-based mixture on the carbon body, or slip coating the silicon-based mixture on the carbon body.

5. The method of claim 4, wherein the silicon-based mixture comprises:
the silicon particles;
a carrier fluid; and
at least one adhesion promoter.

6. The method of claim 1, further comprising forming a substantially oxygen free environment, wherein heating the staggered arrangement to react the silicon particles with the carbon body comprises heating the staggered arrangement to react the silicon particles with the carbon body in the substantially oxygen free environment.

7. The method of claim 6, wherein forming the substantially oxygen-free environment comprises forming a partial vacuum to form the substantially oxygen-free environment.

8. The method of claim 1, wherein aligning the plurality of carbon preform segments in the staggered arrangement further comprises forming a multi-tiered arrangement of the plurality of carbon preform segments.

9. The method of claim 1, further comprising mechanically compressing the staggered arrangement while heating of the staggered arrangement to react the silicon particles with the carbon body.

10. The method of claim 1, further comprising machining the ceramic matrix composite component into a shape of a disk brake.

11. The method of claim 1, wherein the respective shapes of the plurality of carbon preform segments are selected from the group consisting of cube, square-prism, rectangular-prism, pentagonal-prism, and hexagonal-prism.

12. The method of claim 1, wherein heating the staggered arrangement to bond the plurality of carbon preform segments together forms a plurality of bond seams along the respective straight sides of the adjacent carbon preform segments where the respective straight sides abut, wherein the plurality of bond seams form at least one non-continuous line across the at least one layer.

13. A method for forming a ceramic matrix composite component, the method comprising:
forming a plurality of carbon preform segments, wherein forming a carbon preform segment comprises:
forming a carbon body comprising at least one of a plurality of carbon fibers or a carbon foam; and
coating the carbon body with a silicon-based mixture comprising silicon particles, wherein coating the carbon body with the silicon-based mixture comprises at least one of submersing the carbon body in the silicon-based mixture, spray coating the silicon-based mixture on the carbon body, or slip coating the silicon-based mixture on the carbon body;
aligning the plurality of carbon preform segments in a staggered arrangement; and
heating the staggered arrangement to react the silicon particles with the carbon body to bond the plurality of carbon preform segments together and form the ceramic matrix composite component.

14. The method of claim 13, wherein forming the carbon body comprises:
needling a plurality of fiber layers comprising carbon precursor fibers;
carbonizing the carbon precursor fibers to form the plurality of carbon fibers; and
densifying the carbon body.

15. The method of claim 13, wherein the silicon-based mixture comprises:
the silicon particles;
a carrier fluid; and
at least one adhesion promoter.

16. The method of claim 13, further comprising forming a substantially oxygen free environment, wherein heating the staggered arrangement to react the silicon particles with the carbon body comprises heating the staggered arrangement to react the silicon particles with the carbon body in the substantially oxygen free environment.

17. The method of claim 16, wherein forming the substantially oxygen-free environment comprises forming a partial vacuum to form the substantially oxygen-free environment.

18. The method of claim 13, wherein aligning the plurality of carbon preform segments in the staggered arrangement further comprises forming a multi-tiered arrangement of the plurality of carbon preform segments.

19. The method of claim 13, further comprising mechanically compressing the staggered arrangement while heating of the staggered arrangement to react the silicon particles with the carbon body.

20. The method of claim 13, further comprising machining the ceramic matrix composite component into a shape of a disk brake.

* * * * *